US012424254B2

United States Patent
Uchida et al.

(10) Patent No.: US 12,424,254 B2
(45) Date of Patent: Sep. 23, 2025

(54) STORAGE DEVICE, ELECTRONIC APPARATUS, AND METHOD OF MANUFACTURING STORAGE DEVICE

(71) Applicant: SONY SEMICONDUCTOR SOLUTIONS CORPORATION, Kanagawa (JP)

(72) Inventors: Hiroyuki Uchida, Kanagawa (JP); Yo Sato, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 130 days.

(21) Appl. No.: 18/252,860

(22) PCT Filed: Nov. 5, 2021

(86) PCT No.: PCT/JP2021/040707
§ 371 (c)(1),
(2) Date: May 12, 2023

(87) PCT Pub. No.: WO2022/107609
PCT Pub. Date: May 27, 2022

(65) Prior Publication Data
US 2024/0013827 A1    Jan. 11, 2024

(30) Foreign Application Priority Data

Nov. 20, 2020  (JP) ................................ 2020-193279

(51) Int. Cl.
*G11C 11/16*    (2006.01)
*H10B 61/00*    (2023.01)
(Continued)

(52) U.S. Cl.
CPC ............ *G11C 11/161* (2013.01); *H10B 61/22* (2023.02); *H10N 50/01* (2023.02); *H10N 50/10* (2023.02); *H10N 50/80* (2023.02)

(58) Field of Classification Search
CPC ...... G11C 11/161; H10B 61/22; H10N 50/01; H10N 50/10; H10N 50/80
(Continued)

(56) References Cited

U.S. PATENT DOCUMENTS 10,069,064 B1 *   9/2018  Haq ........................ H10N 50/80
10,141,037 B2 * 11/2018  Ohsawa ................. H10N 50/10
(Continued)

FOREIGN PATENT DOCUMENTS

JP    2012-014787 A    1/2012
TW      202011394 A    3/2020

OTHER PUBLICATIONS

Mangin, et al., "Current-induced magnetization reversal in nanopillars with perpendicular anisotropy", Nature Materials, vol. 5, Mar. 2006, pp. 210-215.

*Primary Examiner* — Fernando Hidalgo
(74) *Attorney, Agent, or Firm* — CHIP LAW GROUP

(57) ABSTRACT

A storage device according to an aspect of the present disclosure includes a plurality of storage elements (e.g., MTJ element) each including a fixed layer with a fixed magnetization direction, a storage layer with a changeable magnetization direction, and an insulating layer provided between the fixed layer and the storage layer, an underlayer (e.g., lower insulating layer) on which the plurality of storage elements is provided in an array, and a semiconductor substrate having a surface on which the underlayer is laminated. The underlayer has an inclined surface inclined with respect to the surface, and any of the plurality of storage elements is provided on the inclined surface.

10 Claims, 10 Drawing Sheets

(51) Int. Cl.
*H10N 50/01* (2023.01)
*H10N 50/10* (2023.01)
*H10N 50/80* (2023.01)

(58) Field of Classification Search
USPC .......................................................... 365/158
See application file for complete search history.

(56) References Cited

U.S. PATENT DOCUMENTS

| | | | |
|---|---|---|---|
| 10,418,548 B2 * | 9/2019 | Han | ....................... H10N 50/10 |
| 2005/0020011 A1 * | 1/2005 | Nakajima | ............. H01F 41/308 |
| | | | 438/257 |

* cited by examiner

STORAGE DEVICE, ELECTRONIC APPARATUS, AND METHOD OF MANUFACTURING STORAGE DEVICE

CROSS REFERENCE TO RELATED APPLICATIONS

This application is a U.S. National Phase of International Patent Application No. PCT/JP2021/040707 filed on Nov. 5, 2021, which claims priority benefit of Japanese Patent Application No. JP 2020-193279 filed in the Japan Patent Office on Nov. 20, 2020. Each of the above-referenced applications is hereby incorporated herein by reference in its entirety.

FIELD

The present disclosure relates to a storage device, an electronic apparatus, and a method of manufacturing the storage device.

BACKGROUND

Along with rapid development of various information apparatuses from large-capacity servers to mobile terminals, further improvement in performance such as higher integration, higher speed, and lower power consumption has been pursued in elements such as memories and logics configuring the information apparatuses. In particular, advancement of nonvolatile semiconductor memories is remarkable, and for example, a flash memory as a large-capacity file memory is spreading at a speed of expelling a hard disk drive. On the other hand, considering the use for code storage and application to working memories, various types of semiconductor memories such as a ferroelectric random access memory (FeRAM), a magnetic random access memory (MRAM), and a phase-change random access memory (PCRAM) are being developed in order to replace current general NOR flash memory, dynamic random access memory (DRAM), and the like. Some of them have already been put to practical use.

The MRAM, which is one of the above-described semiconductor memories, stores information by using electrical resistance changes by changing a magnetization state (reversing a magnetization direction) of a magnetic substance of a magnetic storage element included in the MRAM. Therefore, stored information can be read by determining a resistance state of the magnetic storage element determined by the change in the magnetization state, specifically, a magnitude of electric resistance of the magnetic storage element. This MRAM is capable of high-speed operation, can be rewritten almost infinitely ($10^{15}$ times or more), and has high reliability. Therefore, the MRAM is already used in fields such as industrial automation and aircraft. In addition, the MRAM is expected to be extended to the code storage and the working memory in the future because of its high-speed operation and high reliability.

Among the MRAMs as described above, an MRAM that reverses the magnetization of the magnetic substance using spin torque magnetization reversal has the above-described advantages such as high-speed operation and can also achieve low power consumption and large capacity, and thus has further high expectations. Note that the MRAM using spin torque magnetization reversal is called a spin transfer torque-magnetic random access memory (STT-MRAM).

The STT-MRAM includes, as the magnetic storage element, a magnetic tunnel junction (MTJ) element having two magnetic layers (storage layer and fixed layer) and an insulating layer (e.g., MgO) sandwiched between the magnetic layers. Note that the MTJ element is also referred to as a tunneling magneto resistive (TMR) element. In the above STT-MRAM, it has been proposed to form MTJ elements having different thermal stability, i.e., different storage layer thicknesses in a wafer (for example, Patent Literature 1).

CITATION LIST

Patent Literature

Patent Literature 1: JP 2012-14787 A

Non Patent Literature

Non Patent Literature 1: S. Mangin et al. Nature materials, vol. 5 Mar. 2006, p. 210

SUMMARY

Technical Problem

In the STT-MRAM as described above, when MTJ elements having greatly different write voltages are formed in a wafer, such as for non-volatile (NV) and low power (LP) uses, lamination of the MTJ elements having different insulating layer thicknesses (e.g., MgO film thickness) is conceivable. In this case, since it is necessary to repeat the film formation (MTJ film formation) for forming the MTJ element twice or more, the number of manufacturing steps increases, and the manufacturing process becomes complicated.

In addition, when the MTJ elements are arranged on the same plane of the wear, for example, ion beam in ion beam etching (IBE) processing may be blocked by one element nearby in a place where an element interval becomes the narrowest. In this case, it becomes difficult to remove redeposit (reattached deposit) causing a short-circuited element from the other element, and thus a yield decreases.

Therefore, the present disclosure provides a storage device, an electronic apparatus, and a method of manufacturing the storage device capable of improving productivity.

Solution to Problem

A storage device according to an aspect of the present disclosure includes a plurality of storage elements each including a fixed layer with a fixed magnetization direction, a storage layer with a changeable magnetization direction, and an insulating layer provided between the fixed layer and the storage layer; an underlayer on which the plurality of storage elements are provided in an array; and a semiconductor substrate having a surface on which the underlayer is laminated. The underlayer has an inclined surface inclined with respect to the surface, and any of the plurality of storage elements is provided on the inclined surface.

DESCRIPTION OF EMBODIMENTS

Figure 1:
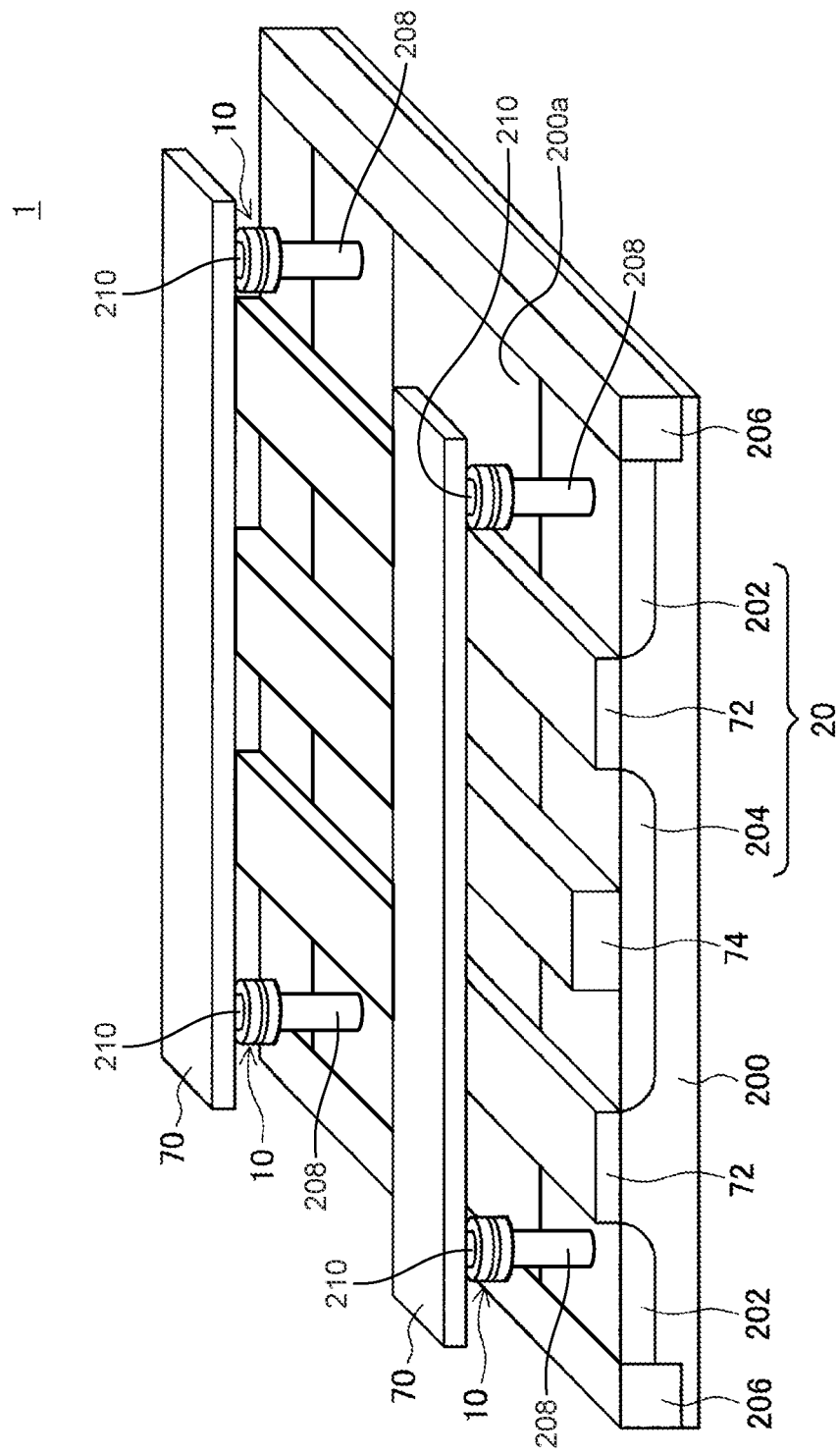
FIG. 1 is a perspective view illustrating an example of a schematic configuration of a storage device according to a first embodiment.

Hereinafter, embodiments of the present disclosure will be described with reference to the drawings. Note that a device, apparatus, method, and the like according to the present disclosure are not limited by the embodiments. In each of the following embodiments, the same parts are given the same reference signs to omit redundant description.

In the description below, one or more embodiments (including examples and modifications) can be implemented independently. On the other hand, at least some of the plurality of embodiments described below may be appropriately combined with at least some of other embodiments. The plurality of embodiments may include novel features different from each other. Therefore, the plurality of embodiments can contribute to solving different objects or problems, and can exhibit different effects. Note that the effects in each embodiment are merely examples and are not limited, and other effects may be provided.

In addition, the drawings referred to in the following description are drawings for facilitating the description and understanding of an embodiment of the present disclosure, and shapes, dimensions, ratios, and the like illustrated in the drawings may be different from actual ones for the sake of clarity. Furthermore, the elements and the like illustrated in the drawings can be appropriately modified in design in consideration of the following description and known techniques. In addition, in the following description, a vertical direction of a laminate structure of the element and the like corresponds to a relative direction when a surface of a substrate on which the element is provided is facing upward, and may be different from the vertical direction according to actual gravitational acceleration.

In the following description, terms such as "perpendicular direction" (direction perpendicular to a film surface or laminating direction of laminate structure) and "in-plane direction" (direction parallel to the film surface or direction perpendicular to the laminating direction of the laminate structure) are used for convenience when describing a magnetization direction (magnetic moment) and magnetic anisotropy. However, these terms do not necessarily mean the exact direction of magnetization. For example, an expression such as "the magnetization direction is the perpendicular direction" or "having perpendicular magnetic anisotropy" means that magnetization in the perpendicular direction is superior to magnetization in the in-plane direction. Similarly, for example, an expression such as "the magnetization direction is the in-plane direction" or "having in-plane magnetic anisotropy" means that magnetization in the in-plane direction is superior to magnetization in the perpendicular direction.

The present disclosure will be described according to the following order of items.

1. First Embodiment
  1-1. Configuration example of storage device
  1-2. Configuration example of storage element (MTJ element)
  1-3. Writing and reading of storage element
  1-4. STT-MRAM of in-plane magnetization type and perpendicular magnetization type
  1-5. Method of manufacturing storage element
  1-6. First modification of base
  1-7. Second modification of base
  1-8. Method of forming inclined surface of base
  1-9. Action and effect
2. Second Embodiment
3. Other embodiment
4. Configuration example of electronic apparatus
  4-1. Imaging device
  4-2. Game machine
5. Appendix

1. First Embodiment

<1-1. Configuration Example of Storage Device>

A configuration example of a storage device (magnetic storage device) 1 according to a first embodiment will be described with reference to FIG. 1. FIG. 1 is a perspective view illustrating an example of a schematic configuration of the storage device 1 according to the first embodiment. The storage device 1 is a storage device that holds information in the magnetization direction of a magnetic substance.

As illustrated in FIG. 1, the storage device 1 according to the first embodiment includes a plurality of MTJ elements 10. Each of the plurality of MTJ elements 10 is arranged near an intersection of two types of address wirings, e.g., a bit line 70 and a gate electrode (word line) 72 intersecting (orthogonal to) each other, and is provided in a matrix. The MTJ element 10 has two terminals, and one terminal is electrically connected to the bit line 70 and the other terminal is electrically connected to a selection transistor 20.

The MTJ element 10 is an example of a storage element, and the matrix is an example of an array.

The selection transistor 20 is provided on a semiconductor substrate 200 such as a silicon substrate, and is formed in a region separated by an element separation layer 206 provided on the semiconductor substrate 200. The selection transistor 20 is a transistor for selecting the MTJ element 10. The selection transistor 20 includes the gate electrode (word line) 72, a source region 202, and a drain region 204.

In the storage device 1, a plurality of memory cells is arranged on the semiconductor substrate 200. In the example in FIG. 1, one memory cell includes the MTJ element 10 and one selection transistor 20 for selecting the MTJ element 10. Therefore, FIG. 1 extracts and illustrates a portion corresponding to four memory cells.

The gate electrode 72 is provided so as to extend in a depth direction in FIG. 1, and also serves as the word line. A wiring 74 is provided on the drain region 204, and the wiring 74 is electrically connected to the drain region 204. The drain region 204 is configured such that its potential can be appropriately changed via the wiring 74. In the example in FIG. 1, the drain region 204 is formed in common to the selection transistors 20 arranged adjacent to each other.

A contact layer 208 is provided on the source region 202, and the contact layer 208 is electrically connected to the source region 202. The MTJ element 10 is provided on the contact layer 208, and the MTJ element 10 is electrically connected to the contact layer 208. The contact layer 208 electrically connects the source region 202 of the selection transistor 20 and the MTJ element 10. The contact layer 208 is, for example, a contact via and is an example of a through wiring. The contact layer 208 functions as an upper electrode.

A contact layer 210 is provided on the MTJ element 10, and the contact layer 210 is electrically connected to the MTJ element 10. On the contact layer 210, the bit line 70 is provided so as to extend in a direction orthogonal to the gate electrode (word line) 72, and the bit line 70 is electrically connected to the contact layer 210. The contact layer 210 electrically connects the MTJ element 10 and the bit line 70. The contact layer 210 is, for example, a contact via and is an example of a through wiring. The contact layer 210 functions as a lower electrode.

An insulating layer 30 is provided on a surface 200a that is an upper surface of the semiconductor substrate 200. The insulating layer 30 includes a lower insulating layer 32 and an upper insulating layer 34. The lower insulating layer 32 includes the contact layers 208, the gate electrodes (word lines) 72, the wirings 74, and the like. The upper insulating layer 34 includes the MTJ elements 10, the contact layers 210, the bit lines 70, and the like.

The lower insulating layer 32 has a flat surface M1 and an inclined surface M2. The flat surface M1 is a plane parallel to the surface (e.g., a wafer surface) 200a of the semiconductor substrate 200. The inclined surface M2 is a plane inclined with respect to the surface 200a of the semiconductor substrate 200. The MTJ elements 10 are provided on the flat surface M1 and the inclined surface M2. The lower insulating layer 32 functions as an underlayer when the MTJ elements 10 are formed. The lower insulating layer 32 is an example of the underlayer.

The above storage device 1 is provided with a power supply circuit (not illustrated) capable of applying a desired current to the gate electrode (word line) 72 and the bit line 70. At the time of writing information, the power supply circuit applies a voltage to the address wiring, i.e., the gate electrode (word line) 72 and the bit line 70, corresponding to a desired memory cell to perform writing and causes the current to flow through the MTJ element 10. Note that the MTJ element 10 can write 1/0 information by inverting a magnetic moment of a predetermined layer (storage layer 106 to be described later) by spin torque magnetization reversal (described later in detail).

On the other hand, at the time of reading information, the storage device 1 applies the voltage to the gate electrode (word line) 72 corresponding to a desired memory cell to be read by the power supply circuit, and detects the current flowing from the bit line 70 through the MTJ element 10 to the selection transistor 20. Since the electrical resistance of the MTJ element 10 changes according to the direction of the magnetic moment in a predetermined layer (storage layer 106 described later) of the MTJ element 10 due to a tunnel magnetoresistance (TMR) effect, the 1/0 information can be read based on a magnitude of a detected current value. In this case, since the current at the time of reading is much smaller than the current flowing at the time of writing, the magnetic direction in the predetermined layer of the MTJ element 10 does not change at the time of reading. In other words, the MTJ element 10 can read information in a non-destructive manner.

<1-2. Configuration Example of Storage Element (MTJ Element)>

Figure 2:
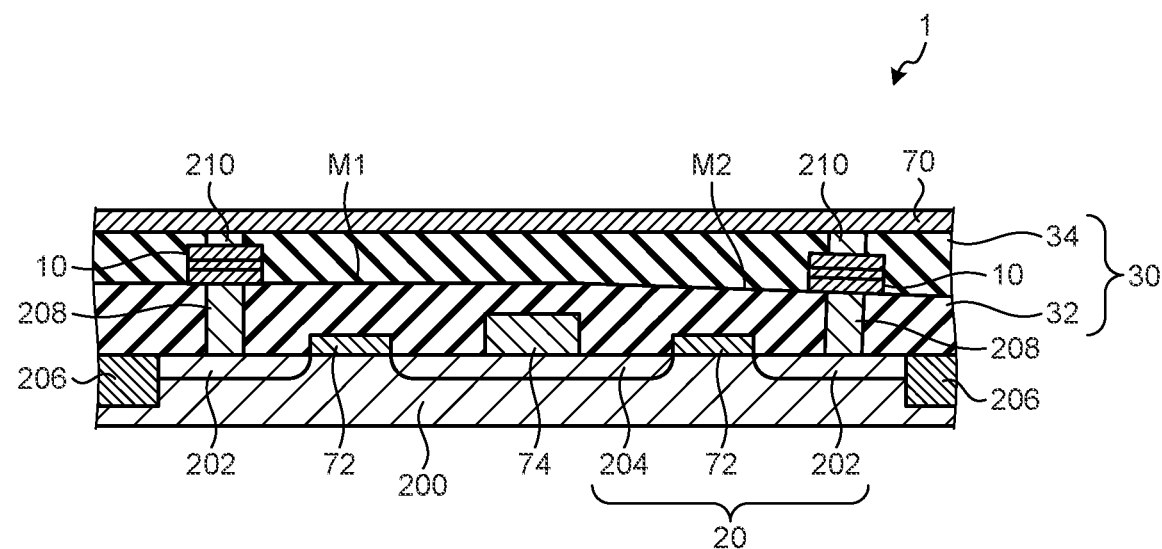
FIG. 2 is a cross-sectional view illustrating an example of a schematic configuration of the storage device according to the first embodiment.
Figure 3:
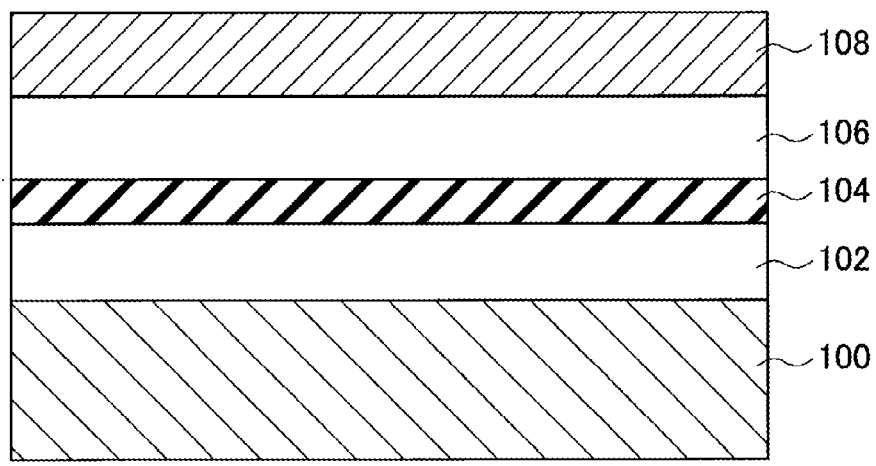
FIG. 3 is a cross-sectional view illustrating an example of a schematic configuration of a storage element according to the first embodiment.

A configuration example (basic structure) of the MTJ element 10 of the storage element according to the first embodiment, e.g., the STT-MRAM using the spin torque magnetization reversal, will be described with reference to FIG. 2. FIG. 2 is a cross-sectional view illustrating an example of a schematic configuration of the MTJ element 10. The MTJ element 10 is a magnetic storage element that stores one piece of information (1/0).

As illustrated in FIG. 2, the MTJ element 10 includes an underlayer 100, a fixed layer 102, an insulating layer 104, a storage layer 106, and a cap layer 108. The underlayer 100, the fixed layer 102, the insulating layer 104, the storage layer 106, and the cap layer 108 are laminated in the described order. The insulating layer 104 is also called a tunnel insulating layer (tunnel barrier layer).

The MTJ element 10 defines "0" and "1" of information by a relative angle between magnetization of the fixed layer 102 and magnetization of the storage layer 106. For example, the MTJ element 10 configures a perpendicular magnetization STT-MRAM. In other words, the magnetization direction of the magnetic layers (fixed layer 102 and storage layer 106) included in a laminate structure of the MTJ element 10 is a direction perpendicular to the film surface (layer surface), in other words, the laminating direction of the laminate structure.

Although not illustrated in the example in FIG. 2, the MTJ element 10 is sandwiched between the upper electrode and the lower electrode (contact layers 208 and 210). In the MTJ element 10, a voltage is applied between the lower electrode and the upper electrode of the MTJ element 10 via the gate electrode (word line) 72 and the bit line 70, and information is written to and read from the storage layer 106 of the MTJ element 10.

In the MTJ element 10, the magnetization direction of the storage layer 106 is reversed by the spin torque magnetization reversal, but the magnetization direction orientation of the fixed layer 102 is not reversed. In other words, the magnetization direction is fixed. In addition, the insulating layer 104 is sandwiched between the fixed layer 102 and the storage layer 106.

The underlayer 100 is provided on the semiconductor substrate 200 via the lower electrode. For example, the underlayer 100 is configured with a film for controlling crystal orientation of the fixed layer 102 and improving an adhesion strength to the lower electrode.

The fixed layer 102 is a layer whose magnetization direction is fixed (fixed magnetization layer). The fixed layer 102 is formed of a ferromagnetic substance having a magnetic moment whose magnetization direction is fixed in the perpendicular direction, and a direction of the magnetic moment is fixed by a high coercive force or the like. The fixed layer 102 is formed in, for example, a laminated ferrimagnetic pin structure including at least two ferromagnetic layers and a nonmagnetic layer.

The insulating layer 104 is formed of various nonmagnetic substances and the like, and is provided so as to be sandwiched between the fixed layer 102 and the storage layer 106. The insulating layer 104 is a layer formed of an insulating material such as MgO. In addition to the above-described materials, the insulating layer 104 can also be configured using, for example, various insulators, dielectrics, and semiconductors of $Al_2O_3$, AlN, $SiO_2$, $Bi_2O_3$, $MgF_2$, CaF, $SrTiO_2$, $AlLaO_3$, and Al—N—O.

The storage layer 106 is a layer whose magnetization direction is changeable, for example, reversible. The storage layer 106 is formed of the ferromagnetic substance having a magnetic moment in which the magnetization direction freely changes in the perpendicular direction, and a direction of the magnetic moment changes according to information stored. The storage layer 106 stores information according to the magnetization state of the magnetic substance, and may be formed of one layer or may have a structure in which a plurality of layers are laminated. The information is stored in the magnetization direction of the storage layer 106 having uniaxial anisotropy.

For example, writing is performed by applying a current to the storage layer 106 in the perpendicular direction and causing the spin torque magnetization reversal. In other words, when a write current flowing in the laminating direction of the storage layer 106 and the fixed layer 102 is applied, the magnetization direction of the storage layer 106 changes to store information in the storage layer 106. Note that the fixed layer 102 is provided via the insulating layer 104 of the tunnel barrier film with respect to the storage layer 106 in which the magnetization direction is reversed by spin transfer, and is used as a reference of storage information (magnetization direction) of the storage layer 106.

The cap layer 108 is formed of, for example, various metal materials such as Ta, an alloy material, and an oxide material. The cap layer 108 protects each laminated layer during the manufacture of the MTJ element 10. The cap layer 108 may function as a hard mask.

The MTJ element 10 having the above laminate structure is manufactured, for example, by continuously forming the underlayer 100 to the cap layer 108 in a vacuum apparatus, and then forming a pattern of the MTJ element 10 by processing such as etching. The MTJ elements 10 are arranged in a matrix (see FIG. 1).

Here, for example, Co—Fe—B is used as the storage layer 106 and the fixed layer 102. Since the fixed layer 102 is the reference of information, the magnetization direction needs to remain unchanged by recording or reading, but the fixed layer is not necessarily fixed in a specific direction as long as the magnetization is made less likely to move than that of the storage layer 106 by increasing the coercive force, the film thickness, or a magnetic damping constant than that of the storage layer 106.

When the magnetization is fixed, an antiferromagnetic substance such as PtMn or IrMn may be brought into contact with the fixed layer 102, or the magnetic substance brought into contact with the antiferromagnetic substance may be magnetically coupled via a nonmagnetic substance such as Ru to indirectly fix the fixed layer 102.

In addition, in a perpendicular magnetization film in the storage layer 106, a composition is adjusted such that a magnitude of an effective demagnetizing field received by the perpendicular magnetization film is smaller than saturation magnetization Ms. As described above, the ferromagnetic substance Co—Fe—B composition of the storage layer 106 is selected, and the magnitude of the effective demagnetizing field received by the storage layer 106 is reduced so as to be smaller than saturation magnetization Ms of the storage layer 106. As a result, the magnetization of the storage layer 106 is oriented in the perpendicular direction.

In addition, when the insulating layer 104 that is the tunnel barrier layer is formed of magnesium oxide (MgO), a magnetoresistance change rate (MR ratio) can be increased. By increasing the MR ratio in this manner, the efficiency of the spin transfer in the MTJ element 10 can be improved, and the current density necessary for reversing the magnetization direction of the storage layer 106 can be reduced. In the present embodiment, the material of the insulating layer 104 as an intermediate layer may be replaced with a metal material, and the spin transfer may be performed by a giant magnetoresistance (GMR) effect.

According to the configuration of the MTJ element 10 described above, the storage layer 106 is configured such that the magnitude of the effective demagnetizing field received by the storage layer 106 is smaller than the saturation magnetization Ms of the storage layer 106. As a result, the demagnetizing field received by the storage layer 106 is reduced, and a write current amount necessary for reversing the magnetization direction of the storage layer 106 can be reduced. This is because inversion current of the perpendicular magnetization STT-MRAM is applied so that the storage layer 106 has perpendicular magnetic anisotropy, which is advantageous in terms of the demagnetizing field. In addition, since the write current amount can be reduced without reducing the saturation magnetization Ms of the storage layer 106, sufficient saturation magnetization Ms of the storage layer 106 can secure the thermal stability of the storage layer 106. As a result, the MTJ element 10 having an excellent characteristic balance can be configured.

In addition, since the fixed layer 102 has the laminated ferrimagnetic pin structure, the sensitivity of the fixed layer 102 is reduced with respect to an external magnetic field so that a leakage magnetic field caused by the fixed layer 102 is shielded, and the perpendicular magnetic anisotropy of the fixed layer 102 can be enhanced by interlayer coupling of the plurality of magnetic layers. As described above, since the thermal stability, which the information holding capability can be sufficiently secured, the MTJ element 10 having the excellent characteristic balance can be configured. Note that the above method of fixing the magnetization direction of the fixed layer 102 can be used regardless of whether the fixed layer 102 is below or above the storage layer 106.

Here, a structure in which the laminated ferrimagnetic pin structure is provided on a lower side (i.e., underlayer 100 side) with respect to the storage layer 106 is also referred to as a bottom pin structure, and a structure in which the laminated ferrimagnetic pin structure is provided on an upper side (i.e., cap layer 108 side) with respect to the storage layer 106 is also referred to as a top pin structure. In other words, the MTJ element 10 may have either the bottom pin structure or the top pin structure.

Note that, in the example in FIG. 2, a structure in which the insulating layer 104 and the fixed layer 102 are laminated in the downward direction with respect to the storage layer 106 is illustrated as the laminate structure of the MTJ element 10, but the structure of the MTJ element 10 is not particularly limited. For example, another layer may be added to the MTJ element 10, or the positions of the fixed layer 102 and the storage layer 106 may be exchanged to configure the MTJ element 10. As an example, the MTJ element 10 may be configured by adding an insulating layer (upper tunnel barrier layer) and a fixed layer (upper fixed magnetization layer) between the storage layer 106 and the cap layer 108 in the described order. In this case, the fixed layer 102 functions as a lower fixed magnetization layer, and the insulating layer 104 functions as a lower tunnel barrier layer.

<1-3. Writing and Reading of Storage Element>

A mechanism of writing and reading information into and from the MTJ element 10 will be described. First, a mechanism of writing information into the MTJ element 10 will be described. As described above, in the MTJ element 10, information is written into the storage layer 106 using the spin torque magnetization reversal.

Here, details of the spin torque magnetization reversal will be described. It is known that an electron has two kinds of spin angular momentum. Therefore, the spin angular momentum is defined as two types of spin angular momenta, namely, upward spin angular momentum and downward spin angular momentum. The upward spin angular momentum and the downward spin angular momentum are the same amount inside the nonmagnetic substance, and they are different inside the ferromagnetic substance.

Furthermore, magnetic moment directions of the fixed layer 102 and the storage layer 106 are in an antiparallel state different from each other in the MTJ element 10, and thus a case of causing electrons enter the storage layer 106 from the fixed layer 102 in this state is considered below.

When the electrons pass through the fixed layer 102, spin polarization occurs. In other words, a difference occurs in the amount of upward spin angular momentum and downward spin angular momentum. Furthermore, when the insulating layer 104 is sufficiently thin, the electrons can enter the storage layer 106 before the spin polarization relaxes and becomes a non-polarized state in a normal nonmagnetic substance (the number of upward and downward electrons is the same).

In the storage layer 106, the direction of spin polarization is opposite to that of electrons that have entered. Therefore, in order to lower the energy of the entire system, a part of the electrons that have entered is inverted. In other words, the direction of the spin angular momentum is changed. At this point, since the spin angular momentum is stored in the entire system, a reaction equivalent to a total change of the spin angular momentum due to the inverted electrons is applied to the magnetic moment (magnetization direction) of the storage layer 106.

When the current, i.e., the number of electrons passing in a unit time, is small, the total number of electrons that change the direction is also small, and thus the change of the spin angular momentum generated in the magnetic moment of the storage layer 106 is also small. On the other hand, when the current, i.e., the number of electrons passing in the unit time, is increased, a desired spin angular momentum change can be given to the magnetic moment of the storage layer 106 in the unit time. A temporal change of the spin angular momentum is torque, and when the torque exceeds a predetermined threshold, the magnetic moment of the storage layer 106 starts to invert and becomes stable in a state of being inverted by 180 degrees. Note that the magnetic moment of the storage layer 106 becomes stable in the state of being inverted by 180 degrees because there is an easy magnetization axis in the magnetic substance configuring the storage layer 106 and thus there is uniaxial anisotropy. By the mechanism as described above, the MTJ element 10 changes from the antiparallel state to the parallel state in which the directions of the magnetic moments of the fixed layer 102 and the storage layer 106 are the same.

In addition, in the parallel state, when the current is caused to reversely flow in a direction in which electrons enter from the storage layer 106 to the fixed layer 102, the electrons inverted by being reflected on the fixed layer 102, when reaching the fixed layer 102, apply torque to the storage layer 106 at entering the storage layer 106. Therefore, the magnetic moment of the storage layer 106 is inverted by the torque applied, and the MTJ element 10 changes from the parallel state to the antiparallel state.

However, an amount of the inversion current for causing inversion from the parallel state to the antiparallel state is larger than that for inversion from the antiparallel state to the parallel state. Note that with respect to the inversion from the parallel state to the antiparallel state, briefly, the magnetic moment of the fixed layer 102 is fixed and thus inversion in the fixed layer 102 is difficult. The magnetic moment of the storage layer 106 is inverted in order to store the spin angular momentum of the entire system. As described above, the storage of 1/0 in the MTJ element 10 is performed by causing the current equivalent to or larger than the predetermined threshold corresponding to each polarity to flow in the direction from the fixed layer 102 toward the storage layer 106 or in the opposite direction. In this way, 1/0 is written in the MTJ element 10 by inverting the magnetic moment of the storage layer 106 in the MTJ element 10 to change the resistance state of the MTJ element 10.

Next, a mechanism of reading information in the MTJ element 10 will be described. In the MTJ element 10, information is read from the storage layer 106 using a magnetoresistance effect. Specifically, when the current is caused to flow between the lower electrode (not illustrated) and the upper electrode (not illustrated) sandwiching the MTJ element 10, the resistance state of the MTJ element 10 changes based on whether the directions of the magnetic moments of the fixed layer 102 and the storage layer 106 are parallel to each other or antiparallel to each other. Then, the information stored in the storage layer 106 can be read by determining the resistance state of the MTJ element 10, i.e., the magnitude of the electric resistance indicated by the MTJ element 10.

<1-4. STT-MRAM of In-Plane Magnetization Type and Perpendicular Magnetization Type>

The STT-MRAM includes an in-plane magnetization STT-MRAM using the magnetic substance having the magnetic anisotropy in the in-plane direction and a perpendicular magnetization STT-MRAM using the magnetic substance having the magnetic anisotropy in the perpendicular direction. In general, the perpendicular magnetization STT-MRAM is considered to be more suitable for reducing power and increasing capacity than the in-plane magnetization STT-MRAM. This is because the perpendicular magnetization STT-MRAM has a lower energy barrier to be exceeded at the time of the spin torque magnetization reversal, and is advantageous in maintaining the thermal stability of the storage carrier in which the high magnetic anisotropy of the perpendicular magnetization film is reduced due to the increase in capacity.

Specifically, assuming that the inversion current of the in-plane magnetization STT-MRAM is Ic_para, the inversion current from the parallel state to the antiparallel state is:

$$Ic\_para=(A \cdot \alpha \cdot Ms \cdot V/g(0)/P)(Hk+2\pi Ms), \text{ and}$$

the inversion current from the antiparallel state to the parallel state is:

$$Ic\_para=-(A \cdot \alpha \cdot Ms \cdot V/g(\pi)/P)(Hk+2\pi Ms).$$

In addition, when the inversion current of the perpendicular magnetization STT-MRAM is Ic_perp, the inversion current from the parallel state to the antiparallel state is:

$$Ic\_perp=(A \cdot \alpha \cdot Ms \cdot V/g(0)/P)(Hk-4\pi Ms), \text{ and}$$

the inversion current from the antiparallel state to the parallel state is:

$$Ic\_perp=-(A \cdot \alpha \cdot Ms \cdot V/g(\pi)/P)(Hk-4\pi Ms).$$

Note that A is a constant, a is a damping constant, Ms is saturation magnetization, V is element volume, g (0) P and g (π) P are coefficients corresponding to efficiency at which spin torque is transmitted to a counterpart magnetic layer in the parallel state and the antiparallel state, respectively, and Hk is magnetic anisotropy (see Non Patent Literature 1).

In each of the above expressions, when (Hk−4πMs) in the case of the perpendicular magnetization type is compared with (Hk+2πMs) in the case of the in-plane magnetization type, it can be understood that the perpendicular magnetization type is more suitable for reducing the storage current. In other words, (Hk−4πMs) in the case of the perpendicular magnetization STT-MRAM is smaller than (Hk+2πMs) in the case of the in-plane magnetization STT-MRAM. Therefore, it can be understood that the perpendicular magnetization STT-MRAM is more suitable from a viewpoint of reducing the inversion current at the time of writing because the inversion current is small.

<1-5. Method of Manufacturing Storage Element>

Figure 4:
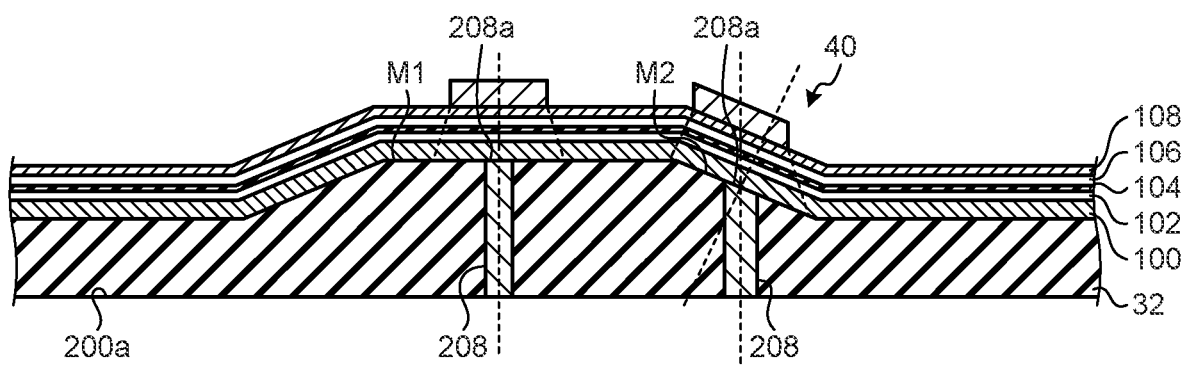
FIG. 4 is a first cross-sectional view illustrating an example of a manufacturing process of the storage element according to the first embodiment.
Figure 5:
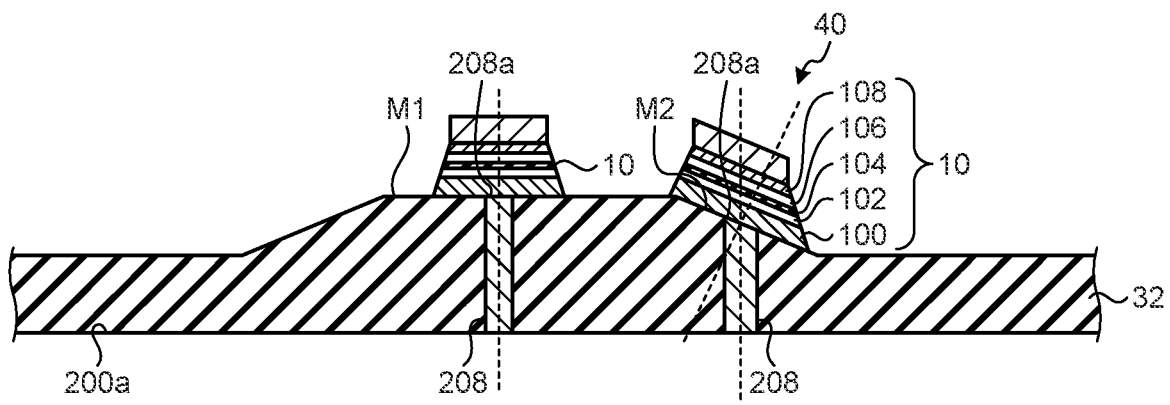
FIG. 5 is a second cross-sectional view illustrating an example of the manufacturing process of the storage element according to the first embodiment.
Figure 6:
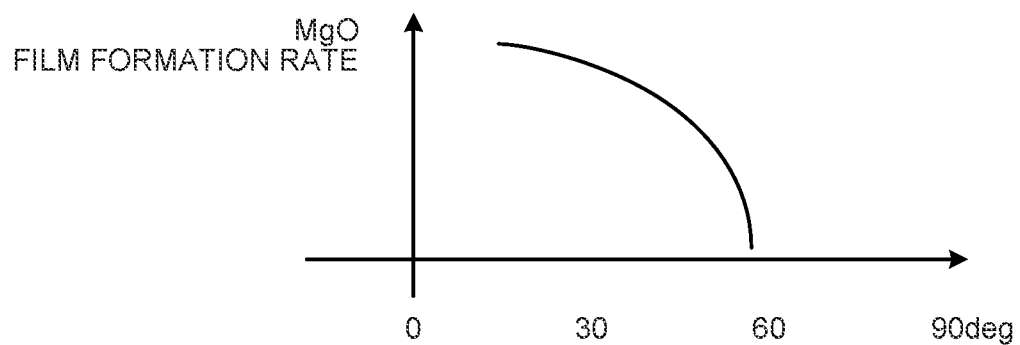
FIG. 6 is a graph illustrating an angle dependence of an MgO film formation rate according to the first embodiment.

An example of a method of manufacturing the MTJ element 10 (method of manufacturing the storage device 1) according to the first embodiment will be described with reference to FIGS. 4 to 6. FIGS. 4 and 5 are cross-sectional views illustrating an example of a manufacturing process of the MTJ element 10 according to the first embodiment. FIG. 6 is a graph illustrating an angle dependence of an MgO film formation rate according to the first embodiment.

As illustrated in FIG. 4, the lower insulating layer 32 is laminated on the surface 200a of the substrate (upper surface of semiconductor substrate 200). The lower insulating layer 32 has a protrusion including the flat surface M1 and the inclined surface M2. The contact layer 208 is positioned on each of the flat surface M1 and the inclined surface M2, and is formed so as to extend in the perpendicular direction. An exposed surface 208a, which is an upper surface of the contact layer 208, is a surface where the contact layer 208 is exposed from the lower insulating layer 32 and is inclined at the same inclination angle and direction as the inclined surface M2. The exposed surface 208a is included in the inclined surface M2. On this lower insulating layer 32, the underlayer 100, the fixed layer 102, the insulating layer 104, the storage layer 106, and the cap layer 108 are laminated in the described order by a film forming method such as sputtering (e.g., DC magnetron sputtering method and RF magnetron sputtering method).

Further, a photomask 40 is formed on the cap layer 108. The photomask 40 is formed, for example, by laminating a photoresist layer on the cap layer 108 by a spin coating method or the like and patterning the photoresist layer according to the shape and size of the MTJ element 10. The photomask 40 is used as a mask, and etching is sequentially performed on the cap layer 108, the storage layer 106, the insulating layer 104, the fixed layer 102, the underlayer 100, and the like. As illustrated in FIG. 5, the MTJ element 10 is formed on the upper surface of the lower insulating layer 32, i.e., the flat surface M1 and the inclined surface M2. As the etching, for example, ion beam etching (IBE) or reactive ion etching (RIE) may be used, or a combination thereof may be used.

According to the above manufacturing process, as illustrated in FIG. 4, films from the underlayer 100 to the cap layer 108 are continuously formed in a vacuum apparatus, and then a patterning process is performed by etching or the like, so that the MTJ element 10 is formed on the upper surface of the lower insulating layer 32 as illustrated in FIG. 5. At this point, the MTJ element 10 is formed on each of the flat surface M1 and the inclined surface M2 of the lower insulating layer 32. A thickness (film thickness) of the insulating layer 104 of the MTJ element 10 on the flat surface M1 is different from a thickness of the insulating layer 104 of the MTJ element 10 on the inclined surface M2.

As illustrated in FIG. 6, when an inclination angle of the inclined surface M2 increases, a film formation rate of MgO, i.e., the film formation rate of the insulating layer 104 decreases. In other words, as the inclination angle of the inclined surface M2 increases, the thickness of the insulating layer 104 decreases. By using this characteristic, it is possible to simultaneously form a plurality of MTJ elements 10 having insulating layer 104 with different thicknesses. In other words, the plurality of MTJ elements 10 having different write (hold) characteristics can be simultaneously formed.

Here, with respect to the inclination angle, when the inclination angle is θ, it is desirable to satisfy a relational expression of 0 (deg)<θ<45 (deg). When the inclination angle is inclined to 45 (deg), the thickness (e.g., film thickness of MgO) of the insulating layer 104 is about half based on the COS law, and it is possible to cover a thickness range (e.g., MgO film thickness range) of the insulating layer 104 assumed as the STT-MRAM. On the other hand, when the inclination angle is too large, there is a concern that the redeposit adhering to a side wall of the MTJ element 10 by etching cannot be sufficiently removed, and thus 45 (deg) is set as an upper limit from a general beam angle.

Unless otherwise specified, in the manufacturing process described above, for layers other than the layer made of oxide, it is preferable to form a film using a DC magnetron sputtering method. In addition, unless otherwise specified, the oxide layer is preferably formed by forming a metal layer using an RF magnetron sputtering method or the DC magnetron sputtering method, performing an oxidation treatment (heat treatment) after the film formation, and converting the formed metal layer into an oxide layer.

<1-6. First Modification of Base>

Figure 7:
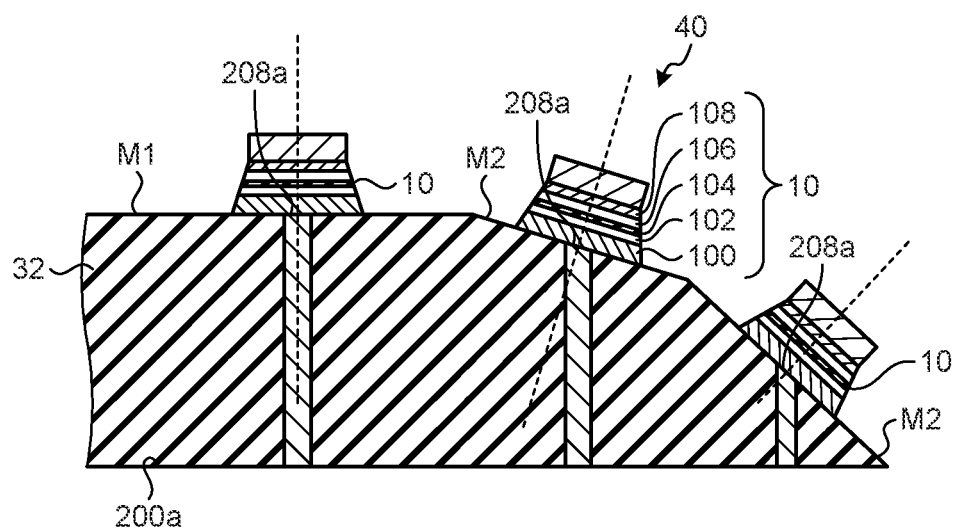
FIG. 7 is a cross-sectional view illustrating a first modification of a base according to the first embodiment.

A first modification of a base (lower insulating layer 32) according to the first embodiment will be described with reference to FIG. 7. FIG. 7 is a cross-sectional view illustrating the first modification of the base (lower insulating layer 32) according to the first embodiment.

As illustrated in FIG. 7, the lower insulating layer 32 has a flat surface M1 and two inclined surfaces M2 having different inclination angles. In this case, it is possible to simultaneously form three MTJ elements 10 having the insulating layer 104 with different thicknesses. In other words, three MTJ elements 10 having different write (hold) characteristics can be simultaneously formed. Note that the number of the inclined surfaces M2 having different inclination angles is not particularly limited, and is changed, for example, according to the number of required different write characteristics. In other words, n types of MTJ elements 10 having different write characteristics can be simultaneously formed by setting the inclination to n (n is an integer of two or more) steps.

<1-7. Second Modification of Base>

Figure 8:
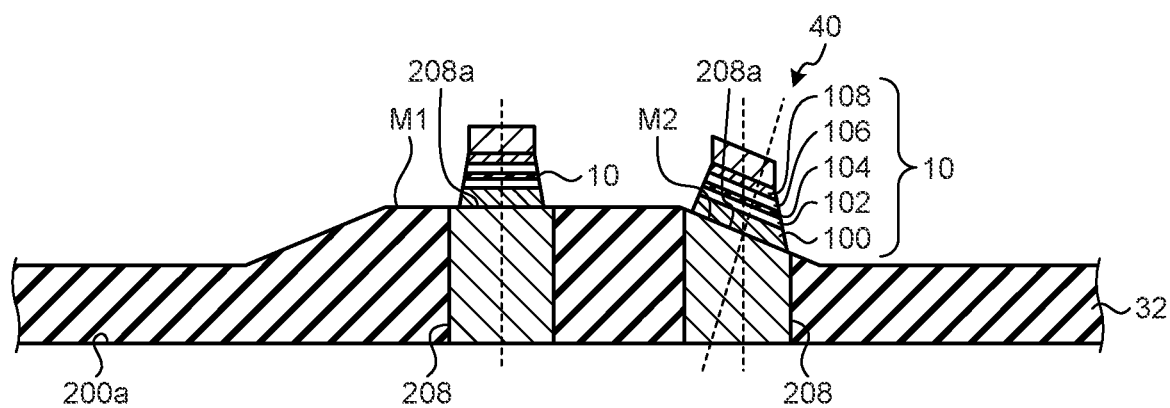
FIG. 8 is a cross-sectional view illustrating a second modification of the base according to the first embodiment.

A second modification of the base (lower insulating layer 32) according to the first embodiment will be described with reference to FIG. 8. FIG. 8 is a cross-sectional view illustrating the second modification of the base (lower insulating layer 32) according to the first embodiment.

As illustrated in FIG. 8, the lower insulating layer 32 includes a plurality of contact layers 208 having a width (length in the in-plane direction) wider than that in FIG. 5. The MTJ element 10 is provided in the exposed surface 208a that is the upper surface of the contact layer 208. An area of the exposed surface 208a is equal to or larger than an area of the lower surface of the MTJ element 10. The exposed surface 208a is included in the inclined surface M2. The exposed surface 208a functions as the inclined surface M2.

<1-8. Method of Forming Inclined Surface of Base>

Figure 9:
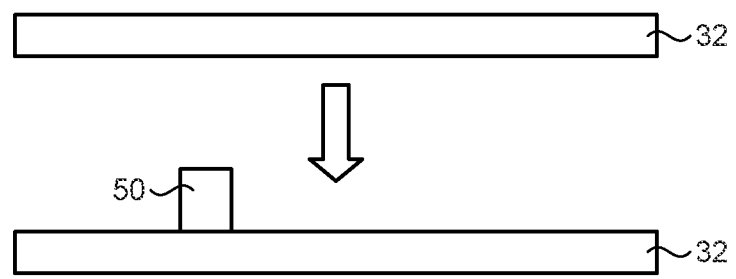
FIG. 9 is a first explanatory diagram illustrating an example of a step of forming an inclined surface of the base according to the first embodiment.
Figure 10:
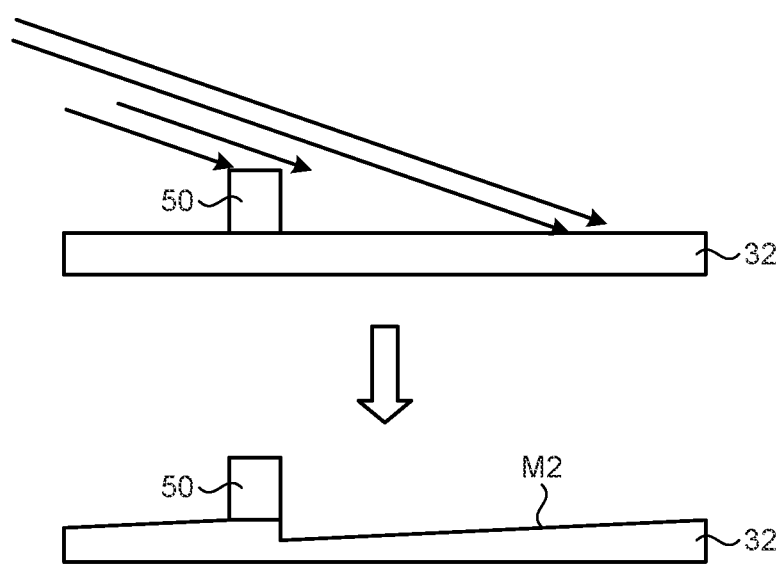
FIG. 10 is a second explanatory diagram illustrating an example of the step of forming the inclined surface of the base according to the first embodiment.
Figure 11:
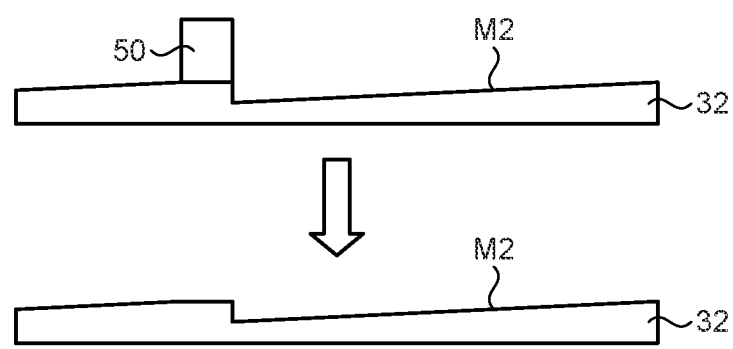
FIG. 11 is a third explanatory diagram illustrating an example of the step of forming the inclined surface of the base according to the first embodiment.

An example of a method of forming the inclined surface M2 of the base (lower insulating layer 32) according to the first embodiment will be described with reference to FIGS. 9 to 11. FIGS. 9 to 11 are diagrams illustrating an example of a process of forming the inclined surface M2 of the base according to the first embodiment.

As illustrated in FIG. 9, a resist layer 50 is patterned on the lower insulating layer 32, and as illustrated in FIG. 10, the lower insulating layer 32 is etched by an ion beam incident on the upper surface of the lower insulating layer 32 at a predetermined inclination angle (oblique ion beam incident on the upper surface of the lower insulating layer 32). At this point, a part of the ion beam is blocked by the resist layer 50 to form the inclined surface M2 on the lower insulating layer 32. Then, as illustrated in FIG. 11, the resist layer 50 is removed after etching. As a result, the lower insulating layer 32 having the inclined surface M2 can be obtained. In the above forming process, the inclination angle and direction of the inclined surface M2 can be adjusted by controlling the patterning of the resist layer 50 and the incident angle of the ion beam, and the presence or absence of the inclined surface M2 can be selected.

Note that the forming process of the inclined surface M2 is not limited to the forming process illustrated in FIGS. 9 to 11 as long as the inclined surface M2 can be formed. In addition, the base is not limited to the lower insulating layer 32 as long as the base (underlayer) can have the inclined surface M2.

<1-9. Action and Effect>

As described above, according to the first embodiment, the lower insulating layer 32, which is an example of the underlayer, has the inclined surface M2 inclined with respect to the surface 200a of the semiconductor substrate 200, and any of the plurality of MTJ elements 10 is provided on the inclined surface M2. As a result, the thickness of the insulating layer 104 of the MTJ element 10 on the inclined surface M2 is different from the thicknesses of the insulating layers 104 of other MTJ elements 10. Therefore, it is possible to simultaneously form the plurality of MTJ elements 10 having different thicknesses of the insulating layer 104, i.e., the plurality of MTJ elements 10 having different write (hold) characteristics. In other words, the number of manufacturing processes can be reduced, and thus productivity can be improved.

For example, the lower insulating layer 32 has the flat surface M1 parallel to the surface 200a of the semiconductor substrate 200, and each MTJ element 10 is provided on the flat surface M1 and the inclined surface M2 (see FIG. 4). As a result, the thickness of the insulating layer 104 of the MTJ element 10 on the inclined surface M2 is different from the thickness of the insulating layer 104 of the MTJ element 10 on the flat surface M1. Therefore, it is possible to simultaneously form a plurality of MTJ elements 10 having different write (hold) characteristics, and thus productivity can be improved.

Furthermore, for example, in addition to the flat surface M1, the lower insulating layer 32 may have the plurality of inclined surfaces M2 having different inclination angles with respect to the surface 200a of the semiconductor substrate 200 (see FIG. 7). In this case, each MTJ element 10 is provided on the flat surface M1 and each of the inclined surfaces M2. As a result, the thickness of the insulating layer 104 of the MTJ element 10 on the inclined surface M2 is different from the thickness of the insulating layer 104 of the MTJ element 10 on the flat surface M1, and the thickness is different for each of the inclined surfaces M2. Therefore, it is possible to simultaneously form a plurality of MTJ elements 10 having different write (hold) characteristics, and thus productivity can be improved.

The lower insulating layer 32 may include the contact layer 208 that is an example of a through-wiring electrically connected to the MTJ element 10 provided on the inclined surface M2. The inclined surface M2 may include the exposed surface 208a where the contact layer 208 is exposed from the lower insulating layer 32. The MTJ element 10 electrically connected to the contact layer 208 may be provided inside the exposed surface 208a (see FIG. 8). The thickness of the insulating layer 104 of the MTJ element 10 on the exposed surface 208a is different from the thicknesses of the insulating layers 104 of other MTJ elements 10. Therefore, even with the configuration in which the MTJ element 10 as described above is provided inside the exposed surface 208a, it is possible to simultaneously form the plurality of MTJ elements 10 having different write (hold) characteristics, and thus productivity can be improved.

2. Second Embodiment

Figure 12:
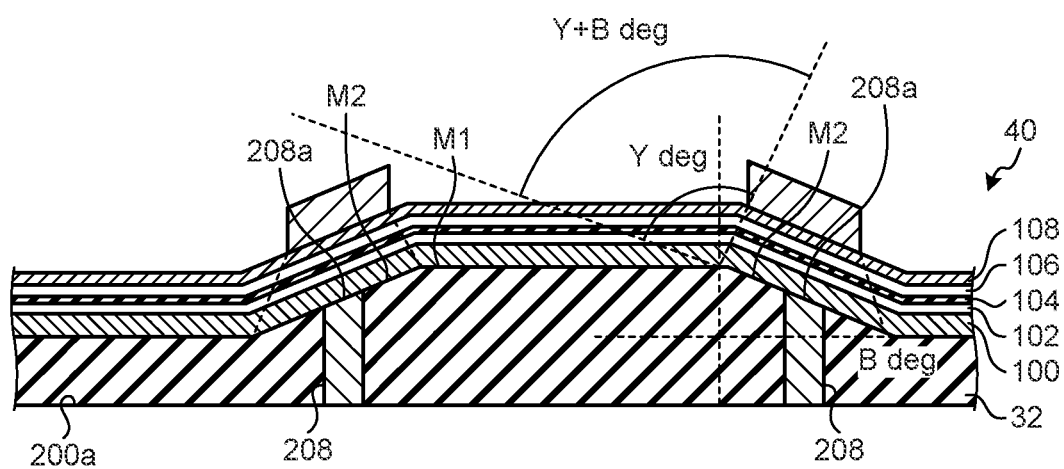
FIG. 12 is a first cross-sectional view illustrating an example of a manufacturing process of the storage element according to a second embodiment.
Figure 13:
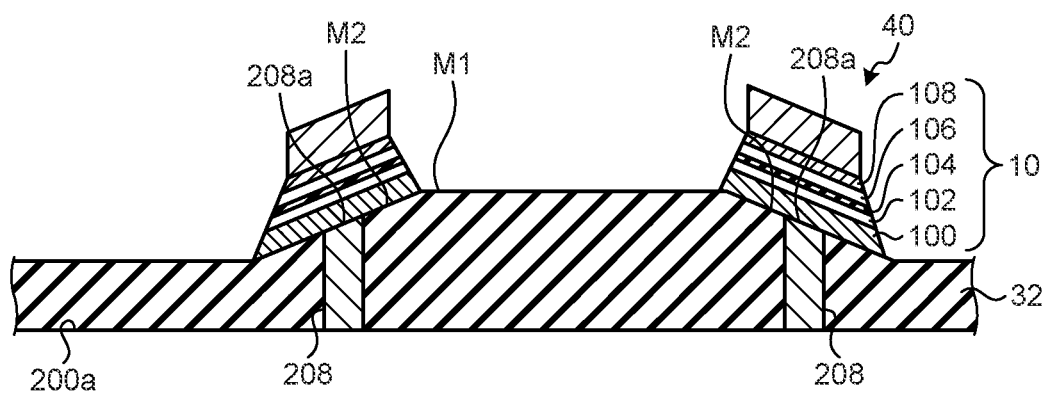
FIG. 13 is a second cross-sectional view illustrating an example of the manufacturing process of the storage element according to the second embodiment.
Figure 14:
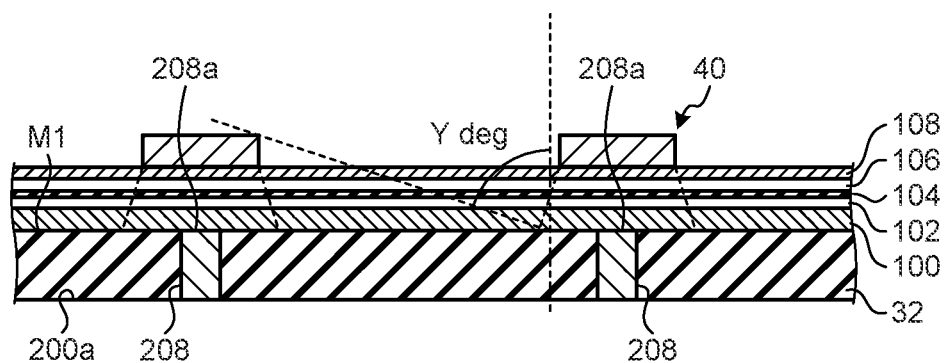
FIG. 14 is a cross-sectional view illustrating a comparative example of the manufacturing process of the storage element according to the second embodiment.

An example of a method of manufacturing the MTJ element 10 (method of manufacturing the storage device 1) according to a second embodiment will be described with reference to FIGS. 12 to 14. FIGS. 12 and 13 are cross-sectional views illustrating an example of the manufacturing process of the MTJ element 10 according to the second embodiment. FIG. 14 is a cross-sectional view illustrating the comparative example of the manufacturing process of the MTJ element 10 according to the second embodiment.

As illustrated in FIG. 12, the lower insulating layer 32 is laminated on the surface 200a of the substrate (upper surface of semiconductor substrate 200). The lower insulating layer 32 has a protrusion including the flat surface M1 and the plurality of inclined surfaces M2. The contact layer 208 is positioned on each of the inclined surfaces M2, and is formed to extend in the perpendicular direction. An exposed surface 208a, which is an upper surface of the contact layer 208, is a surface where the contact layer 208 is exposed from the lower insulating layer 32 and is inclined at the same inclination angle and direction as the inclined surface M2. The exposed surface 208a is included in the inclined surface M2. On this lower insulating layer 32, the underlayer 100, the fixed layer 102, the insulating layer 104, the storage layer 106, and the cap layer 108 are laminated in the described order by a film forming method such as sputtering (e.g., DC magnetron sputtering method and RF magnetron sputtering method).

Further, a photomask 40 is formed on the cap layer 108. The photomask 40 is formed, for example, by laminating a photoresist layer on the cap layer 108 by a spin coating method or the like and patterning the photoresist layer according to the shape and size of the MTJ element 10. The photomask 40 is used as a mask, and etching is sequentially performed on the cap layer 108, the storage layer 106, the insulating layer 104, the fixed layer 102, the underlayer 100, and the like. As illustrated in FIG. 13, the MTJ element 10 is formed on the upper surface of the lower insulating layer 32, i.e., on each of the inclined surfaces M2. As the etching, for example, ion beam etching (IBE) or reactive ion etching (RIE) may be used, or a combination thereof may be used.

According to the above manufacturing process, as illustrated in FIG. 12, films from the underlayer 100 to the cap layer 108 are continuously formed in the vacuum apparatus, and then a patterning process is performed by etching or the like, so that the MTJ element 10 is formed on the upper surface of the lower insulating layer 32 as illustrated in FIG. 13. At this point, the MTJ element 10 is formed on each of the inclined surfaces M2 of the lower insulating layer 32. The inclination angles of the respective inclined surfaces M2 are the same. Therefore, the thickness (film thickness) of the insulating layer 104 of the MTJ element 10 on the inclined surface M2 and the thickness of the insulating layer 104 of the MTJ element 10 on another inclined surface M2 are the same.

In the example in FIG. 12, two inclined surfaces M2 are provided in the lower insulating layer 32 in a place where the MTJ elements 10 are formed with a narrow interval between the MTJ elements 10 (e.g., the narrowest place). For example, the lower insulating layer 32 between the adjacent MTJ elements 10 is formed in a convex shape as illustrated in FIG. 12. The two inclined surfaces M2 are formed such that a separation distance between the inclined surfaces gradually increases toward the surface 200a of the semiconductor substrate 200.

One of the two inclined surfaces M2 has +a degree (positive value) with respect to the in-plane direction (e.g., wafer film surface direction), and the other inclined surface M2 has −b degree (negative value) with respect to the in-plane direction. Numerical values a and b may be the same or different. As described above, the respective inclination directions of the two inclined surfaces M2 are different. Note that "+" and "−" indicate that the inclination directions are opposite. For example, the inclination direction may be defined two-dimensionally or three-dimensionally.

According to the above layout, an upper limit of angle at which the ion beam is blocked can be increased by an inclination angle B (deg) of the inclined surface M2. The upper limit of this angle is Y+B (deg). In other words, by expanding an incident angle range of the ion beam, it is possible to relatively lay and irradiate the ion beam and to remove the redeposit adhering to the side wall of the MTJ element 10. Therefore, when the element is processed by ion beam etching (IBE), blocking of the ion beam by the MTJ element 10 is reduced, and a short-circuit failure can be suppressed even when an interval between the MTJ elements 10 is narrowed. Accordingly, the storage device 1 with higher density can be prepared.

On the other hand, in the comparative example illustrated in FIG. 14, the lower insulating layer 32 has only the flat surface M1, and the MTJ elements 10 are formed on the flat surface M1. In this layout, when the ion beam is laid by Y (deg) or more, the ion beam is blocked by an adjacent MTJ element 10 and the photomask 40 thereon. In other words, in a place where the element interval is narrowed, the ion beam in the ion beam etching (IBE) process may be blocked by one adjacent element.

As described above, in the comparative example, when the angle of the ion beam becomes close to horizontal, the ion beam is blocked by the adjacent MTJ element 10 and the photomask 40 thereon, and the removal of the attached substance adhering to the side wall of the MTJ element 10, i.e., redeposit, becomes insufficient, and the short-circuit failure may occur. In order to avoid this short-circuit failure, as described above, the incident angle range of the ion beam is expanded to relatively lay and irradiate the ion beam so that the redeposit adhering to the side wall of the MTJ element 10 can be removed.

As described above, according to the second embodiment, the lower insulating layer 32 has the plurality of inclined surfaces M2 having different inclination directions with respect to the surface 200a of the semiconductor substrate 200, and any one of the MTJ elements 10 is provided on each inclined surface M2. With this layout, at the time of film formation of the adjacent MTJ elements 10, blocking of the ion beam by the respective elements is suppressed, and it becomes easy to remove the redeposit (re-attached deposit) causing a short-circuit failure element from the MTJ elements 10. Therefore, since it is possible to suppress a decrease in yield, productivity can be improved.

For example, the lower insulating layer 32 has the plurality of inclined surfaces M2 in which the separation distance between the surfaces gradually increases toward the surface 200a of the semiconductor substrate 200, and any one of the MTJ elements 10 is provided on each inclined surface M2. With this layout, at the time of forming the adjacent MTJ elements 10, blocking of the ion beam by the elements is further suppressed, and it becomes easy to remove the redeposit causing the short-circuit failure element from the MTJ elements 10. Therefore, since it is possible to suppress a decrease in yield, productivity can be improved.

The inclination angles of the respective inclined surfaces M2 may be the same or different. However, by changing the inclination angle of each inclined surface M2, the same effect as that of the first embodiment can be obtained also in the second embodiment.

3. Other Embodiment

The configuration according to the above embodiment may be implemented in various different forms other than the above embodiments. For example, the configuration is not limited to the above-described example, and may be implemented in various modes. Furthermore, for example, the configuration, the processing procedure, the specific names, and the information including various data and parameters illustrated in the above document and the drawings can be arbitrarily changed unless otherwise specified.

In addition, each component of each device illustrated in the drawings is functionally conceptual, and is not necessarily physically configured as illustrated in the drawings. In other words, a specific form of distribution and integration of each device is not limited to the illustrated form, and all or a part thereof can be functionally distributed and integrated in an arbitrary unit according to various loads, usage conditions, and the like.

For example, each MTJ element 10 according to each of the above-described embodiments and modifications thereof may be used as a magnetoresistive element, and a storage device such as a hard disk drive (HDD) may be configured as the storage device 1.

4. Configuration Example of Electronic Apparatus

As an electronic apparatus including the storage device 1 according to each of the above-described embodiments (including modifications), an imaging device 300 and a game machine 900 will be described with reference to FIGS. 15 to 17. For example, the imaging device 300 and the game machine 900 use the storage device 1 according to each of the above-described embodiments as a memory. Examples of the memory include a flash memory.

<4-1. Imaging Device>

The imaging device 300 including the storage device 1 according to any one of the above-described embodiments will be described with reference to FIG. 15. FIG. 15 is a diagram illustrating an example of a schematic configuration of the imaging device 300 including the storage device 1 according to any one of the above-described embodiments. Examples of the imaging device 300 include electronic apparatuses such as a digital still camera, a video camera, a smartphone having an imaging function, and a mobile phone.

Figure 15:
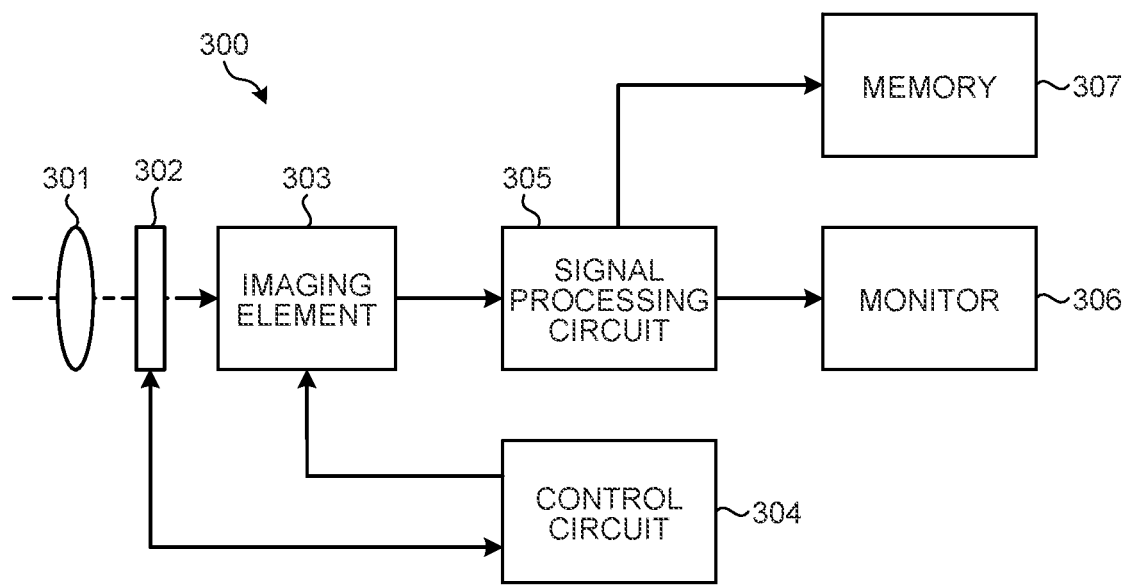
FIG. 15 is a diagram illustrating an example of a schematic configuration of an imaging device provided with the storage device according to the first or second embodiment.

As illustrated in FIG. 15, the imaging device 300 includes an optical system 301, a shutter device 302, an imaging element 303, a control circuit (drive circuit) 304, a signal processing circuit 305, a monitor 306, and a memory 307. The imaging device 300 can capture a still image and a moving image.

The optical system 301 includes one or a plurality of lenses. The optical system 301 guides light (incident light) from a subject to the imaging element 303 and forms an image on a light receiving surface of the imaging element 303.

The shutter device 302 is disposed between the optical system 301 and the imaging element 303. The shutter device 302 controls a light irradiation period and a light shielding period with respect to the imaging element 303 according to the control of the control circuit 304.

The imaging element 303 accumulates signal charges for a certain period according to light formed on the light receiving surface via the optical system 301 and the shutter device 302. The signal charges accumulated in the imaging element 303 are transferred in accordance with a drive signal (timing signal) supplied from the control circuit 304.

The control circuit 304 outputs the drive signal for controlling the transfer operation of the imaging element 303 and the shutter operation of the shutter device 302 to drive the imaging element 303 and the shutter device 302.

The signal processing circuit 305 performs various types of signal processing on the signal charges output from the imaging element 303. An image (image data) obtained by performing the signal processing by the signal processing circuit 305 is supplied to the monitor 306 and also supplied to the memory 307.

The monitor 306 displays a moving image or a still image captured by the imaging element 303 based on the image data supplied from the signal processing circuit 305. As the monitor 306, for example, a panel type display device such as a liquid crystal panel or an organic electro luminescence (EL) panel is used.

The memory 307 stores the image data supplied from the signal processing circuit 305, i.e., image data of the moving image or the still image captured by the imaging element 303. The memory 307 includes the storage device 1 according to any one of the above-described embodiments.

Also in the imaging device 300 configured as described above, the productivity can be improved by using the storage device 1 described above as the memory 307.

<4-2. Game Machine>

The game machine 900 including the storage device 1 according to any one of the above-described embodiments will be described with reference to FIGS. 16 and 17. FIG. 16 is a perspective view (appearance perspective view) illustrating an example of a schematic configuration of the game machine 900 including the storage device 1 according to any one of the above-described embodiments. FIG. 17 is a block diagram illustrating an example of a schematic configuration of the game machine 900.

Figure 16:
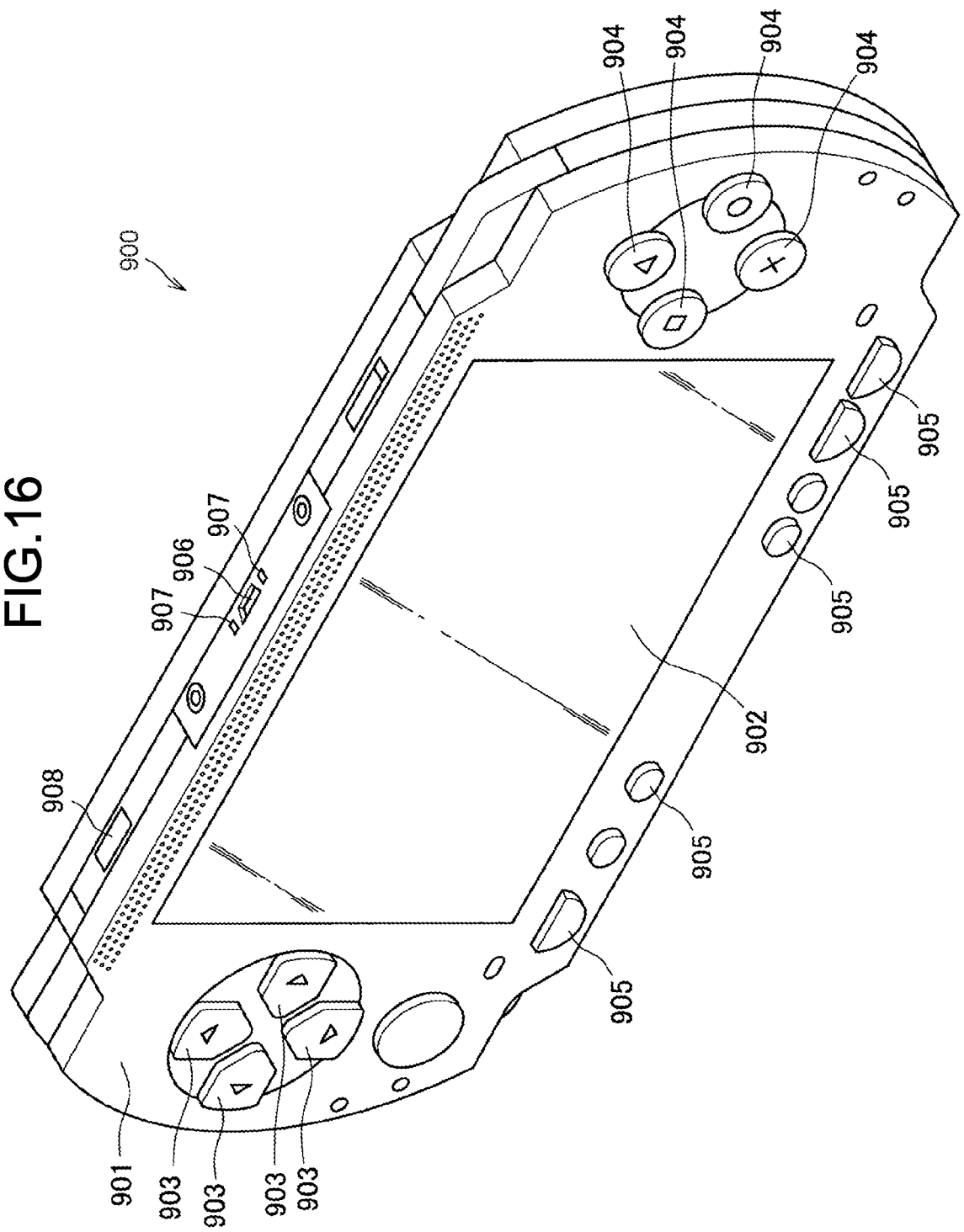
FIG. 16 is a perspective view illustrating an example of an appearance of a game machine provided with the storage device according to the first or second embodiment.

As illustrated in FIG. 16, the game machine 900 has an appearance, for example, in which each component is disposed inside and outside an outer casing 901 formed in a horizontally long flat shape.

On the front surface of the outer casing 901, a display panel 902 is provided at the center in a longitudinal direction. Further, operation keys 903 and operation keys 904 are provided on the left and right sides of the display panel 902, respectively, spaced apart in the circumferential direction. Operation keys 905 are provided at a lower end of the front surface of the outer casing 901. The operation keys 903, 904, and 905 function as direction keys, decision keys, and the like, and are used for selection of menu items displayed on the display panel 902, progress of a game, and the like.

On the upper surface of the outer casing 901, a connection terminal 906 for connecting an external device, a power supply terminal 907, a light receiving window 908 for performing infrared communication with the external device, and the like are provided.

Figure 17:
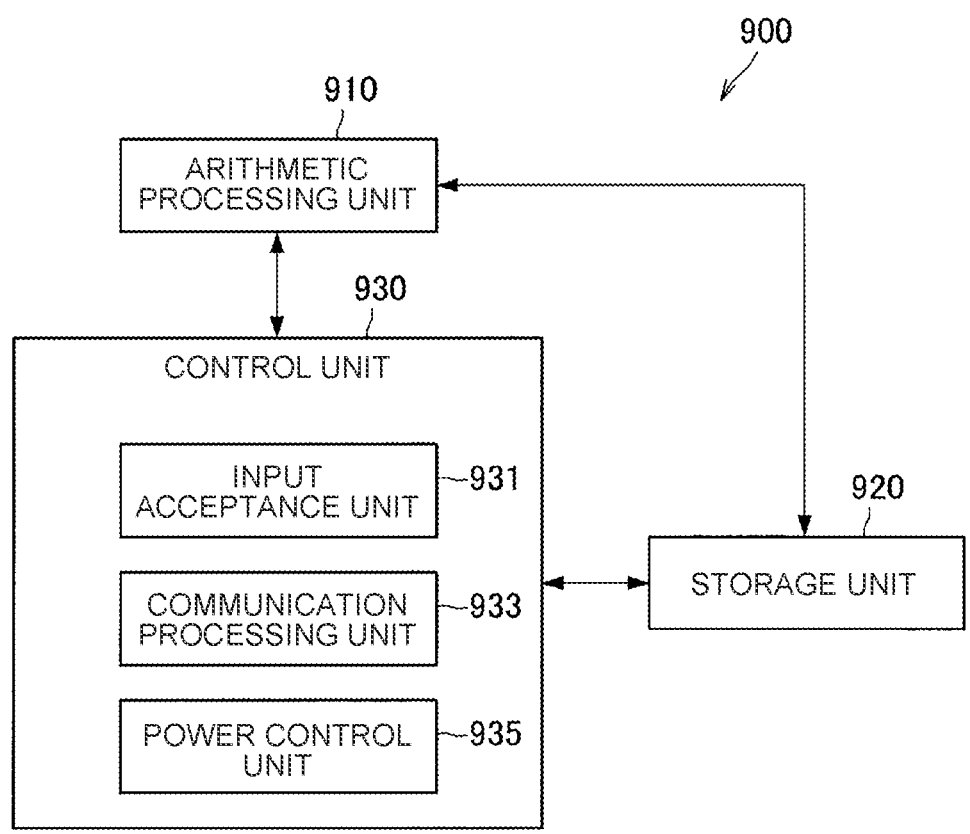
FIG. 17 is a block diagram illustrating an example of a schematic configuration of the game machine according to FIG. 16.

As illustrated in FIG. 17, the game machine 900 includes an arithmetic processing unit 910 including a central processing unit (CPU), a storage unit 920 that stores various types of information, and a control unit 930 that controls each configuration of the game machine 900. Power is supplied to the arithmetic processing unit 910 and the control unit 930 from, for example, a battery (not illustrated) or the like.

The arithmetic processing unit 910 generates a menu screen for allowing the user to set various types of information or select an application. In addition, the arithmetic processing unit 910 executes the application selected by the user.

The storage unit 920 holds various types of information set by the user. The storage unit 920 includes the storage device 1 according to any one of the above-described embodiments.

The control unit 930 includes an input acceptance unit 931, a communication processing unit 933, and a power control unit 935. The input acceptance unit 931 detects, for example, states of the operation keys 903, 904, and 905. Furthermore, the communication processing unit 933 performs communication processing with the external device.

The power control unit 935 controls power supplied to each unit of the game machine 900.

Even in the game machine 900 configured as described above, the productivity can be improved by using the storage device 1 described above as the storage unit 920.

Note that the storage device 1 according to each of the above-described embodiments may be mounted on the same semiconductor chip together with a semiconductor circuit of an arithmetic device or the like to configure a semiconductor device (system-on-a-chip: SoC).

Furthermore, the storage device 1 according to each of the above-described embodiments can be mounted on various electronic apparatuses on which the memory (storage unit) can be mounted as described above. For example, the storage device 1 may be mounted on various electronic apparatuses such as a notebook personal computer (PC), a mobile device (e.g., smartphone and tablet PC), a personal digital assistant (PDA), a wearable device, and a music device in addition to the imaging device 300 and the game machine 900. For example, the storage device 1 is used as various memories such as a storage.

5. Appendix

The present technology can also have the following configurations.

(1)
A storage device comprising:
a plurality of storage elements each including a fixed layer with a fixed magnetization direction, a storage layer with a changeable magnetization direction, and an insulating layer provided between the fixed layer and the storage layer;
an underlayer on which the plurality of storage elements are provided in an array; and
a semiconductor substrate having a surface on which the underlayer is laminated, wherein
the underlayer has an inclined surface inclined with respect to the surface, and
any of the plurality of storage elements is provided on the inclined surface.

(2)
The storage device according to (1), wherein
the underlayer has a flat surface parallel to the surface, and
the plurality of storage elements are provided on the flat surface and the inclined surface.

(3)
The storage device according to (2), wherein
the underlayer includes a plurality of the inclined surfaces having different inclination angles with respect to the surface, and
the plurality of storage elements are provided on the flat surface and the plurality of inclined surfaces.

(4)
The storage device according to (1), wherein
the underlayer includes a plurality of the inclined surfaces having different inclination directions with respect to the surface, and
any of the plurality of storage elements is provided on the plurality of inclined surfaces.

(5)
The storage device according to (4), wherein
the underlayer includes the plurality of inclined surfaces in which a separation distance between the plurality of inclined surfaces gradually increases toward the surface, and
any of the plurality of storage elements is provided on the plurality of inclined surfaces.

(6)
The storage device according to (4) or (5), wherein inclination angles of the plurality of inclined surfaces are the same.

(7)
The storage device according to (4) or (5), wherein
the inclination angles of the plurality of inclined surfaces are different.

(8)
The storage device according to any one of (1) to (7), wherein
the underlayer includes a through wiring electrically connected to the storage elements provided on the inclined surface.

(9) The storage device according to (8), wherein
the inclined surface includes an exposed surface on which the through wiring is exposed from the underlayer, and
the storage elements electrically connected to the through wiring is provided inside the exposed surface.

(10)
An electronic apparatus comprising
a storage device that stores information,
the storage device including:
a plurality of storage elements each including a fixed layer with a fixed magnetization direction, a storage layer with a changeable magnetization direction, and an insulating layer provided between the fixed layer and the storage layer,
an underlayer on which the plurality of storage elements is provided in an array, and
a semiconductor substrate having a surface on which the underlayer is laminated, wherein
the underlayer has an inclined surface inclined with respect to the surface, and
any of the plurality of storage elements is provided on the inclined surface.

(11)
A method of manufacturing a storage device, comprising
forming an underlayer having an inclined surface on a surface of a semiconductor substrate; and
forming, on the inclined surface, a storage element including a fixed layer with a fixed magnetization direction, a storage layer with a changeable magnetization direction, and an insulating layer provided between the fixed layer and the storage layer.

(12)
An electronic apparatus including the storage device according to any one of (1) to (9).

(13)
A method of manufacturing the storage device according to any one of (1) to (9).

REFERENCE SIGNS LIST

1 STORAGE DEVICE
10 MTJ ELEMENT
20 SELECTION TRANSISTOR
30 INSULATING LAYER
32 LOWER INSULATING LAYER
34 UPPER INSULATING LAYER
40 PHOTOMASK
50 RESIST LAYER
70 BIT LINE
72 GATE ELECTRODE
74 WIRING

100 UNDERLAYER
102 FIXED LAYER
104 INSULATING LAYER
106 STORAGE LAYER
108 CAP LAYER
200 SEMICONDUCTOR SUBSTRATE
200a SURFACE
202 SOURCE REGION
204 DRAIN REGION
206 ELEMENT SEPARATION LAYER
208 CONTACT LAYER
208a EXPOSED SURFACE
210 CONTACT LAYER
M1 FLAT SURFACE
M2 INCLINED SURFACE

The invention claimed is:

1. A storage device, comprising:
a plurality of storage elements, each including
   a fixed layer with a fixed magnetization direction,
   a storage layer with a changeable magnetization direction, and
   an insulating layer between the fixed layer and the storage layer;
an underlayer on which the plurality of storage elements is in an array; and
a semiconductor substrate having a surface on which the underlayer is laminated, wherein
   the underlayer has a flat surface parallel to the surface and an inclined surface inclined with respect to the surface, and
   the plurality of storage elements is on the flat surface and the inclined surface.

2. The storage device according to claim 1, wherein
the underlayer includes a plurality of inclined surfaces including the inclined surface,
each of the plurality of inclined surfaces has different inclination angles with respect to the surface, and
the plurality of storage elements is on the flat surface and the plurality of inclined surfaces.

3. The storage device according to claim 1, wherein
the underlayer includes a plurality of inclined surfaces including the inclined surface,
each of the plurality of inclined surfaces has different inclination directions with respect to the surface, and
at least one of the plurality of storage elements is on the plurality of inclined surfaces.

4. The storage device according to claim 3, wherein
the underlayer includes the plurality of inclined surfaces in which a separation distance between the plurality of inclined surfaces gradually increases toward the surface.

5. The storage device according to claim 3, wherein
inclination angles of the each of the plurality of inclined surfaces is same.

6. The storage device according to claim 3, wherein
inclination angles of the each of the plurality of inclined surfaces is different.

7. The storage device according to claim 1, wherein
the underlayer includes a through wiring electrically connected to the storage elements on the inclined surface.

8. The storage device according to claim 7, wherein
the inclined surface includes an exposed surface on which the through wiring is exposed from the underlayer, and
the storage elements electrically connected to the through wiring is inside the exposed surface.

9. An electronic apparatus, comprising
a storage device that stores information,
the storage device including:
   a plurality of storage elements each including
      a fixed layer with a fixed magnetization direction,
      a storage layer with a changeable magnetization direction, and
      an insulating layer between the fixed layer and the storage layer,
   an underlayer on which the plurality of storage elements is in an array, and
   a semiconductor substrate having a surface on which the underlayer is laminated, wherein
      the underlayer has a flat surface parallel to the surface and an inclined surface inclined with respect to the surface, and
      the plurality of storage elements is on the flat surface and on the inclined surface.

10. A method of manufacturing a storage device, comprising
forming an underlayer having a flat surface which is parallel to a surface of a semiconductor substrate and an inclined surface which is inclined with respect to the surface of the semiconductor substrate, wherein the underlayer is laminated on the surface; and
forming, on the flat surface and the inclined surface, a plurality of storage elements, where each of the plurality of storage elements include a fixed layer with a fixed magnetization direction, a storage layer with a changeable magnetization direction, and an insulating layer provided between the fixed layer and the storage layer, wherein the plurality of storage elements is in an array on the underlayer.

* * * * *